United States Patent
Lee et al.

(10) Patent No.: US 7,456,438 B2
(45) Date of Patent: Nov. 25, 2008

(54) NITRIDE-BASED SEMICONDUCTOR LIGHT EMITTING DIODE

(75) Inventors: Hyuk Min Lee, Seoul (KR); Hyoun Soo Shin, Seoul (KR); Chang Wan Kim, Suwon (KR); Yong Chun Kim, Suwon (KR)

(73) Assignee: Samsung Electro-Mechanics Co., ltd., Gyunggi-Do (KR)

( * ) Notice: Subject to any disclaimer, the term of this patent is extended or adjusted under 35 U.S.C. 154(b) by 48 days.

(21) Appl. No.: 11/581,797

(22) Filed: Oct. 17, 2006

(65) Prior Publication Data

US 2007/0090378 A1    Apr. 26, 2007

(30) Foreign Application Priority Data

Oct. 17, 2005    (KR) ............... 10-2005-0097407

(51) Int. Cl.
*B23K 31/00* (2006.01)
(52) U.S. Cl. .......... 257/99; 228/179.1; 228/180.1; 228/180.21
(58) Field of Classification Search ........ 25/99; 228/179.1, 180.1, 180.21, 180.22, 180.5
See application file for complete search history.

(56) References Cited

U.S. PATENT DOCUMENTS 6,331,450 B1 * 12/2001 Uemura ............... 438/114
7,196,000 B2 * 3/2007 Lee et al. ............. 438/612

FOREIGN PATENT DOCUMENTS

| CN | 1635634 | 7/2005 |
|----|---------|--------|
| CN | 1659713 | 8/2005 |
| JP | 5-90329 | 4/1993 |
| KR | 10-2005-0029602 | 3/2005 |

* cited by examiner

*Primary Examiner*—Zandra Smith
*Assistant Examiner*—Paul E Patton
(74) *Attorney, Agent, or Firm*—McDermott Will & Emery LLP

(57) ABSTRACT

A nitride-based semiconductor LED which is flip-chip bonded on a lead pattern of a sub-mount through a bump ball comprises a substrate; a light-emitting structure formed on the substrate; an electrode formed on the light-emitting structure; a protective film formed on the resulting structure having the electrode formed therein, the protective film exposing the electrode surface corresponding to a portion which is connected to the lead pattern of the sub-mount through a bump ball; and a grid-shape buffer film formed on the electrode surface exposed through the protective film.

4 Claims, 3 Drawing Sheets

[FIG. 1]
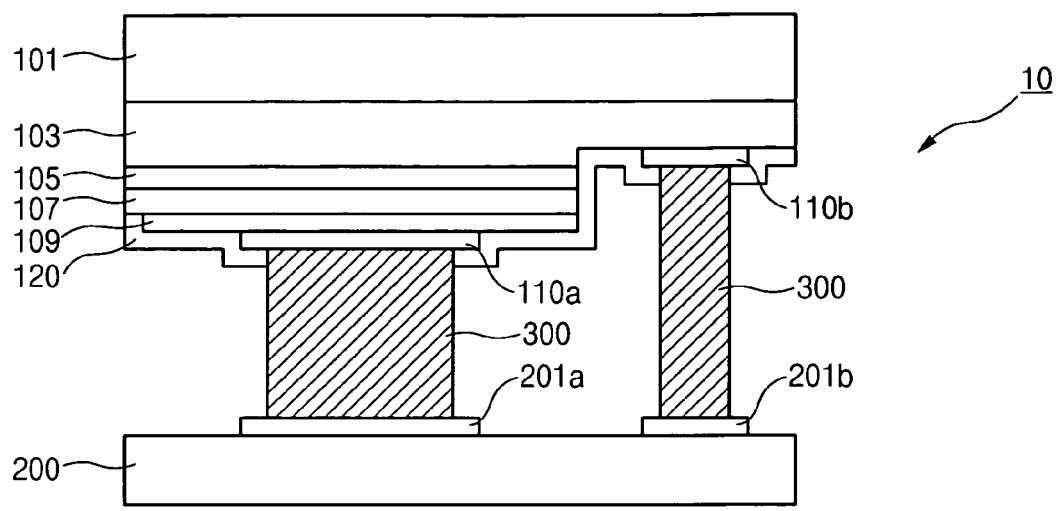
[FIG. 2]
[FIG. 3]
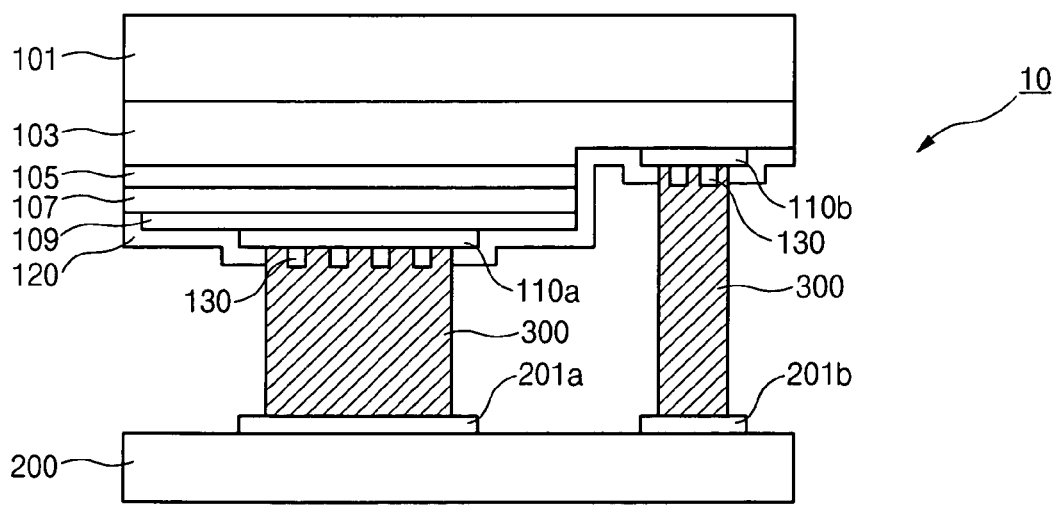

[FIG. 4]
| GRID DENSITY | RELATED ART | PRESENT INVENTION | | |
|---|---|---|---|---|
| | 100% | 70% | 50% | 30% |
| PATTERN | | | | |
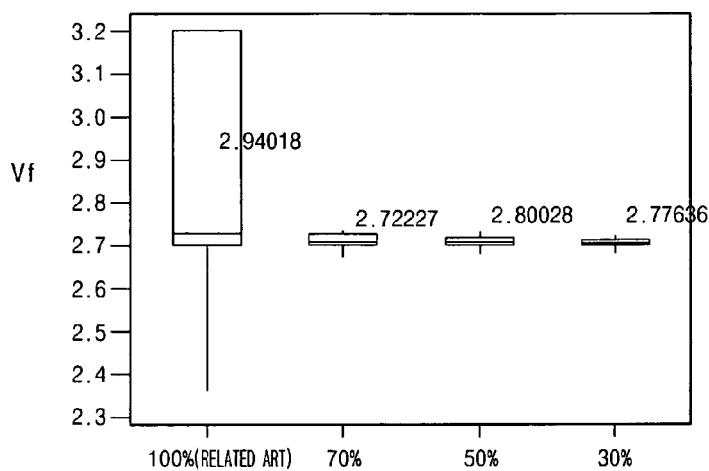
[FIG. 5]
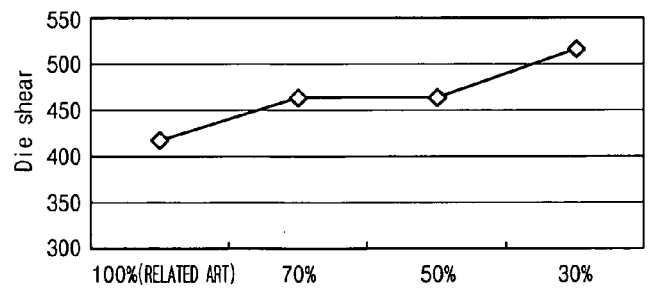
[FIG. 6]

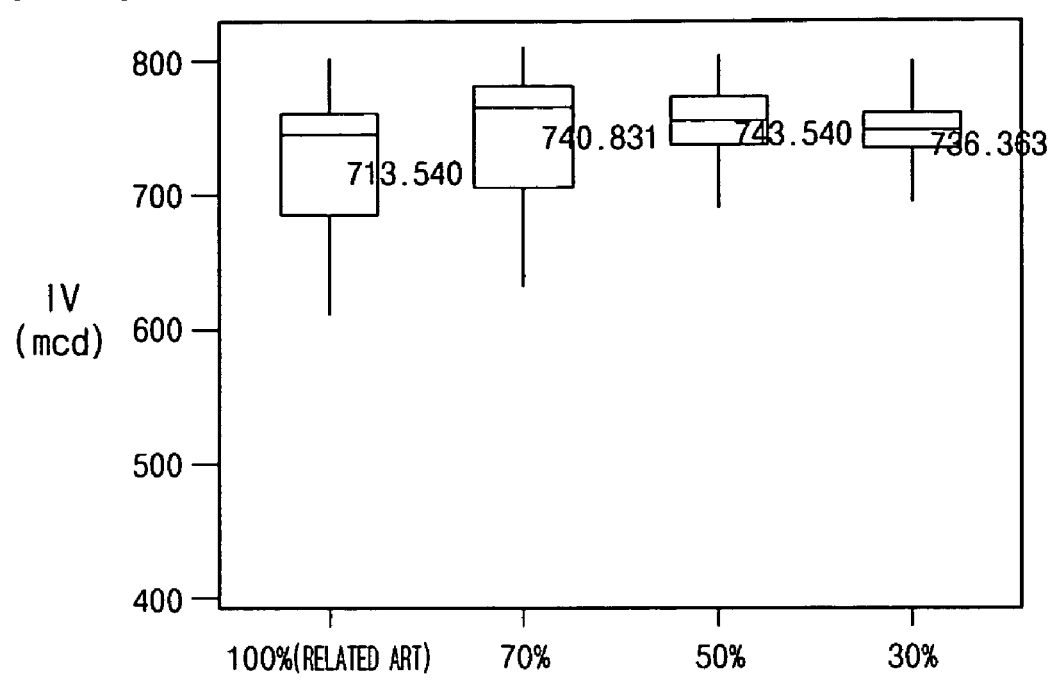
[FIG. 7]

NITRIDE-BASED SEMICONDUCTOR LIGHT EMITTING DIODE

CROSS-REFERENCE TO RELATED APPLICATIONS

This application claims the benefit of Korean Patent Application No. 2005-97407 filed with the Korea Industrial Property Office on Oct. 17, 2005, the disclosure of which is incorporated herein by reference.

BACKGROUND OF THE INVENTION

1. Field of the Invention

The present invention relates to a nitride-based semiconductor light emitting diode (LED). In the nitride-based semiconductor LED, when a flip-chip bonding process is performed, a light-emitting region of a chip can be prevented from being damaged by an excessive load of a bump ball which is more than a critical value.

2. Description of the Related Art

Since nitride-based semiconductors such as GaN and the like have excellent physical and chemical properties, they are considered as essential materials of light emitting diodes, for example, light emitting diodes (LEDs) or laser diode (LDs). Particularly, the nitride-based semiconductor LED can generate blue or green light and ultraviolet light, and the brightness thereof has rapidly increased due to the technical development. Therefore, the nitride-based semiconductor LED is applied to a full-color display board, a lighting device or the like.

The nitride-based semiconductor LED is manufactured of nitride semicondcutor materials having a compositional formula of $In_XAl_YGa_{1-X-Y}N$ ($0 \leqq X$, $0 \leqq Y$, $X+Y \leqq 1$), in order to obtain blue or green light.

Nitride-based semiconductor crystal is grown on a substrate for growing single crystal such as a sapphire substrate, in consideration of lattice matching. Particularly, since the sapphire substrate is an electrically insulating substrate, a finalized nitride-based semiconductor LED has such a structure that both of a p-electrode and an n-electrode are formed on the same surface.

Because of such a structural characteristic, the nitride-based semiconductor LED is actively developed in the form which is suitable for a flip-chip structure.

Hereinafter, a conventional nitride-based semiconductor LED will be described in detail with reference to FIGS. 1 and 2.

FIG. 1 is a diagram illustrating a bonding process of the conventional nitride-based semiconductor LED. The conventional nitride-based semiconductor LED 10 includes a nitride-based semiconductor LED mounted on a sub-mount 200.

The nitride-based semiconductor LED includes a sapphire substrate 101, a light-emitting structure in which an n-type nitride semiconductor layer 103, an active layer 105, a p-type nitride semiconductor layer 107 are sequentially laminated on the sapphire substrate 101, a p-electrode 110a formed on the p-type nitride semiconductor layer 107, and an n-electrode 110b formed on the n-type nitride semiconductor layer 103.

On the surfaces of the sub-mount 200 corresponding to the p-electrode 110a and the n-electrode 110b of the nitride-based semiconductor LED, p-type and n-type lead patterns 201a and 201b, respectively, are formed so as to be electrically connected thereto. Here, the n-electrode 110a and the p-electrode 110b of the nitride semiconductor LED and the n-type and p-type lead patterns 201a and 201b of the sub-mount are electrically bonded to each other through conductive bump balls 300.

Except for portions of the p-electrode 110a and the n-electrode 110b which are electrically connected to the n-type and p-type lead patterns 201a and 201b of the sub-mount, the nitride-based semiconductor LED is protected by a protective film.

In general, a flip-chip bonding process is where a sub-mount and a nitride-based semiconductor LED are electrically connected through a physical load using a conductive bump ball. In such a flip-chip bonding process, the sub-mount and the nitride-based semiconductor LED are separated unless a load more than a critical value is applied. Therefore, a load more than a critical value is required.

In the conventional nitride-based semiconductor LED, however, the conductive bump balls 300 with a load more than a critical value come in direct contact with the p-electrode 110a and the n-electrode 110b of the nitride-based semiconductor LED, that is, a bonding pad, as shown in FIG. 1. Therefore, when a flip-chip bonding is performed, excessive stress is applied to the nitride semiconductor LED, thereby destroying PN junction of the diode or damaging a light-emitting region. FIG. 2 is a photograph showing the problems occurring when the flip bonding process is performed, showing that the light-emitting region is damaged by an excessive load of the conductive bump ball.

SUMMARY OF THE INVENTION

An advantage of the present invention is that it provides a nitride-based semiconductor LED in which a grid-shaped buffer film is provided at the bonding interface between a bonding pad and bump balls of a nitride-based semiconductor LED, thereby preventing the destruction of PN junction of the diode or the damage of light-emitting region caused by an excessive load of the bump ball which is more than a critical value.

Additional aspect and advantages of the present general inventive concept will be set forth in part in the description which follows and, in part, will be obvious from the description, or may be learned by practice of the general inventive concept.

According to an aspect of the invention, a nitride-based semiconductor LED which is flip-chip bonded on a lead pattern of a sub-mount through a bump ball comprises a substrate; a light-emitting structure formed on the substrate; an electrode formed on the light-emitting structure; a protective film formed on the resulting structure having the electrode formed therein, the protective film exposing the electrode surface corresponding to a portion which is connected to the lead pattern of the sub-mount through the bump ball; and a grid-shaped buffer film formed on the electrode surface exposed through the protective film.

According to another aspect of the invention, the buffer film is formed of a ceramic-based material.

According to a further aspect of the invention, the buffer film is formed of any one of $SiO_2$ and SiN.

According to a still further aspect of the invention, the buffer film is formed of the same material as the protective film.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a diagram illustrating a bonding process of a conventional nitride-based semiconductor LED;

FIG. 2 is a photograph showing problems occurring when a flip-chip bonding process according to the related art is performed;

FIG. 3 is a diagram showing that a grid-shaped buffer film is formed on a bonding pad when a flip-chip bonding process of a nitride-based semiconductor LED according to the present invention is performed;

FIG. 4 is a diagram illustrating modifications of the nitride-based semiconductor LED in accordance with a change in grid density of the buffer film shown in FIG. 3;

FIG. 5 is a diagram comparatively showing operation voltages in accordance with the modifications shown in FIG. 4;

FIG. 6 is a diagram comparatively showing die shear values in accordance with the modifications shown in FIG. 4 and FIG. 7 is a diagram comparatively showing brightness values in accordance with the modification shown in FIG. 4.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, a nitride-based semiconductor LED according to an embodiment of the present invention will be described in detail with reference to the accompanying drawings.

First, the nitride-based semiconductor LED according to an embodiment of the invention will be described with reference to FIG. 3. FIG. 3 is a diagram showing that a lattice-shaped buffer film is formed on a bonding pad at the time of flip-chip bonding of the nitride-based semiconductor LED according to the invention.

As shown in FIG. 3, the nitride-based semiconductor LED according to the invention is flip-chip bonded on lead patterns 201a and 201b of a sub-mount 200 through conductive bump balls 300, the lead patterns being formed of a conductive semiconductor material.

More specifically, the nitride-based semiconductor LED has a light emitting structure in which a buffer layer (not shown), an n-type nitride semiconductor layer 103, an active layer 105, and a p-type nitride semiconductor layer 107 are sequentially laminated on a substrate 101.

Preferably, the substrate 101 is formed of a transparent material including sapphire. In addition to sapphire, the substrate 101 may be formed of zinc oxide (ZnO), gallium nitride (GaN), silicon carbide (SiC), or aluminum nitride (AlN).

The buffer layer (not shown) formed of GaN may be omitted.

The n-type or p-type nitride semiconductor layer 103 or 107 is formed of a GaN layer or GaN/AlGaN layer doped with conductive impurities, and the active layer 105 is formed with a multi-well quantum well structure composed of an InGaN/GaN layer.

Portions of the active layer 105 and the p-type nitride semiconductor layer 107 are removed by mesa-etching, so that the n-type nitride semiconductor layer 103 is partially exposed.

On a predetermined portion of the n-type nitride semiconductor layer 103 exposed by the mesa-etching, an n-electrode 110b is formed so as to serve as an electrode and bonding layer. Here, the n-electrode 110b is formed of Cr/Au, and a separate bonding pad (not shown) may be provided on the n-electrode 110b depending on a characteristic of the process.

On the p-type nitride semiconductor layer 140, a transparent electrode 150 for increasing a current spreading effect is formed. The transparent electrode 150 may be formed of a conductive metal oxide such as ITO (Indium Tin Oxide). Further, the transparent electrode 150 may be also formed of a metallic thin film having high conductivity and low contact resistance, if the metallic thin film has high transmittance with respect to a luminous wavelength of an LED.

On the transparent electrode 50, a p-electrode 110a is formed so as to serve as an electrode and bonding layer. Here, the p-electrode 110a is formed of Cr/Au, and a separate bonding pad (not shown) may be provided on the p-electrode 110a depending on a characteristic of the process.

On the resulting structure in which the p-electrode 110a and the n-electrode 110b are formed, a protective film 120 is formed so as to prevent the p-electrode 110a and the n-electrode 110b from being electrically connected to each other. The protective film 120 exposes portions of the p-electrode 110a and the n-electrode 110b which are connected to the lead patterns 201a and 201b of the sub-mount 200, respectively, through the conductive bump balls 300.

On the surfaces of the p-electrode 110a and the n-electrode 110b exposed through the protective film 120, buffer films 130 are provided so as to buffer stress caused by a load of the conductive bump ball 300 which is more than a critical value.

As shown in FIG. 3, the buffer films 130 according to the invention are formed in a grid shape. Therefore, stress caused by a load of the bump ball 130 which is more than a critical value can be more effectively buffered, and simultaneously, a bonding area of the bump ball is increased, thereby enhancing bonding shear stress (die shear).

The grid density of the buffer film 130 can be adjusted depending on a characteristic of a nitride-based semiconductor LED and a characteristic of a process. FIG. 4 is a diagram showing modifications of the nitride-based semiconductor LED in accordance with grid density of the buffer film shown in FIG. 3. In FIG. 4, the grid densities are represented by 100%, 70%, 50%, and 30%, respectively.

Hereinafter, a nitride-based semiconductor LED provided with grid-shaped buffer films according to the invention will be described in detail with reference to FIGS. 5 to 7.

FIG. 5 is a diagram comparatively showing operation voltages in accordance with the modifications shown in FIG. 4, FIG. 6 is a diagram comparatively showing die shear values in accordance with the modifications shown in FIG. 4, and FIG. 7 is a diagram comparatively showing brightness characteristics in accordance with the modifications shown in FIG. 4.

Referring to FIG. 5, it can be found that an operation voltage (Vf) of the conventional nitride-based semiconductor LED, of which the grid density is 100%, is very unstable, compared with operation voltages (Vf) of the nitride-based semiconductor LEDs of the invention provided with buffer films of which the grid densities are 70%, 50%, and 30%. As such, when the operation voltage (VD becomes unstable, a leakage current and contact resistance increase, thereby degrading the characteristic and reliability of the diode. In the nitride-based semiconductor LED of the invention, however, the operation voltages are stable, which makes it possible to prevent the above-described problems.

Referring to FIG. 6, it can be found that the die shear of each nitride-based semiconductor LED of the invention provided with the grid-shaped buffer film, that is, the bonding shear stress between the nitride-based semiconductor LED and the sub-mount is much higher than that of the conventional nitride-based semiconductor LED, which is not provided with a buffer film and of which the grid density is 100%. Particularly, as the grid density becomes gradually small (from 70% to 30%), the bonding shear stress becomes larger. Accordingly, it is preferable that the buffer film is formed to have small grid density.

Referring to FIG. 7, it can be found that the brightness of the nitride-based semiconductor LED of the invention based on the light diffusion by the grid-shaped buffer film is larger than that of the conventional nitride-based semiconductor LED which is not provided with a buffer film.

As the grid density of the grid-shaped buffer film becomes small as described above, an excellent operation voltage and bonding shear stress can be secured. However, when the grid density is extremely small, the area of the exposed p-electrode and n-electrode becomes smaller than the sectional area of wire for applying electric power to subsequent LED chips at the time of wire-bonding. Therefore, a driving voltage can increase.

Accordingly, it is preferable that the grid-shaped buffer film according to the invention is formed so that the grid density of the buffer film is not smaller than the sectional area of wire.

According to the above-described invention, the grid-shaped buffer film are provided at the bonding interface between the electrode and the bump ball of the nitride-based semiconductor LED. Therefore, it is possible to prevent the nitride-based semiconductor LED from being damaged by an excessive load of the bump ball which is more than a critical value.

Further, the operation voltage, the brightness, and the bonding shear stress of the nitride-based semiconductor LED can be enhanced by the grid-shaped buffer film.

Therefore, it is possible to enhance the characteristic and reliability of the nitride-based semiconductor LED.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A nitride-based semiconductor LED which is flip-chip bonded on a lead pattern of a sub-mount through a bump ball, the nitride-based semiconductor LED comprising:
   a substrate;
   a light-emitting structure formed on the substrate;
   an electrode formed on the light-emitting structure;
   a protective film formed on the resulting structure having the electrode formed therein, the protective film exposing the electrode surface corresponding to a portion which is connected to the lead pattern of the sub-mount through the bump ball; and
   a grid-shaped buffer film formed on the electrode surface exposed through the protective film,
   wherein the buffer film is formed of the same material as the protective film.

2. The nitride-based semiconductor LED according to claim 1,
   wherein the buffer film is formed of a ceramic-based material.

3. The nitride-based semiconductor LED according to claim 2,
   wherein the buffer film is formed of any one of $SiO_2$ and SiN.

4. The nitride-based semiconductor LED according to claim 1,
   wherein a grid density of the grid-shaped buffer film is not smaller than a sectional area of wire.

* * * * *